(12) United States Patent
Lee et al.

(10) Patent No.: US 8,906,717 B2
(45) Date of Patent: Dec. 9, 2014

(54) ORGANIC LIGHT EMITTING DIODE DISPLAY DEVICE HAVING BUILT-IN TOUCH PANEL AND METHOD OF MANUFACTURING THE SAME

(71) Applicant: LG Display Co., Ltd., Seoul (KR)

(72) Inventors: Sang-Kyu Lee, Daejeon (KR); Moo-Chan Kang, Gwangju (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/943,149

(22) Filed: Jul. 16, 2013

(65) Prior Publication Data
US 2014/0166998 A1    Jun. 19, 2014

(30) Foreign Application Priority Data
Dec. 17, 2012    (KR) .......................... 10-2012-0147137

(51) Int. Cl.
*H01L 27/32*    (2006.01)

(52) U.S. Cl.
CPC .................................... *H01L 27/323* (2013.01)
USPC ............................................................ 438/28

(58) Field of Classification Search
CPC .. H01L 27/323; H01L 21/822; H01L 51/0097
USPC ............................................................ 438/28
See application file for complete search history.

*Primary Examiner* — Tran Tran
(74) *Attorney, Agent, or Firm* — Brinks Gilson & Lione

(57) ABSTRACT

An organic light emitting diode (OLED) display device having a built-in touch panel and a manufacturing method thereof in which an OLED array and a touch array are formed on a flexible substrate and thus the OLED display device has flexibility, and a flexible printed circuit board for driving the touch array is integrally formed with a printed circuit board for driving the OLED array and thus manufacturing costs are reduced are disclosed. The OLED display device includes an OLED array formed on a lower flexible substrate, a touch array formed on an upper flexible substrate, and an adhesive layer adhering the upper flexible substrate to the lower flexible substrate such that the touch array and the OLED array face each other.

10 Claims, 12 Drawing Sheets

ORGANIC LIGHT EMITTING DIODE DISPLAY DEVICE HAVING BUILT-IN TOUCH PANEL AND METHOD OF MANUFACTURING THE SAME

This application claims the benefit of priority of Korean Patent Application No. 10-2012-0147137, filed on Dec. 17, 2012, which is hereby incorporated by reference as if fully set forth herein.

FIELD OF THE DISCLOSURE

The present disclosure relates to an organic light emitting diode (OLED) display device having a built-in touch panel, and more particularly, to an OLED display device having a built-in touch panel in which an OLED array and a touch array are formed on respective flexible substrates and thus the OLED display device has a decreased thickness and improved flexibility and a manufacturing method thereof.

DISCUSSION OF THE RELATED ART

Image display devices, which display a variety of information on a screen, are a core technology of information and communication and are developed towards a trend of thinner, lighter, portable, and high performance. Thus, organic light emitting diode (OLED) display devices, which display an image by controlling emission amount of an organic emission layer (EML), have received attention as a flat panel display device that may address problems in terms of weight and volume which occur in cathode ray tubes (CRTs).

An OLED display device includes an OLED, which is self-emissive and emits light using a thin EML between electrodes, and thus may be realized as a thin film such as paper.

An OLED array includes a thin film transistor (TFT) formed in each subpixel region of a substrate and the OLED connected to the TFT and including a first electrode (i.e., anode), an EML, and a second electrode (i.e., cathode) which are sequentially formed. When a voltage is applied between the first and second electrodes, holes and electrons are recombined in the EML to form excitons and, when the excitons drop to a ground state, light is emitted.

In particular, the OLED array is formed on a flexible substrate and thus an OLED display device having flexibility may be manufactured. More particularly, an exfoliation layer is formed on a rigid substrate formed of, for example, glass, the flexible substrate is formed on the exfoliation layer, and the OLED array is formed on the flexible substrate. Subsequently, the exfoliation layer is separated from the flexible substrate.

Meanwhile, to manufacture a flexible OLED display device, an encapsulation substrate covering an OLED array is also formed of a plastic film. However, it is impossible to perform a manufacturing process such as chemical vapor deposition (CVD), sputtering, or the like on the film. Thus, only an add-on type in which a touch array is attached to a film may be applied to the flexible OLED display device.

SUMMARY

An OLED display device includes an OLED array formed on a lower flexible substrate, a touch array formed on an upper flexible substrate, and an adhesive layer adhering the upper flexible substrate to the lower flexible substrate such that the touch array and the OLED array face each other.

The touch array may include X and Y electrodes crossing each other, a pad part, and a routing line connecting the pad part to the X and Y electrodes, wherein the pad part is connected to the OLED array via an anisotropic conductive paste.

In another aspect of the present invention, a method of manufacturing an OLED display device having a built-in touch panel includes forming a lower flexible substrate on a lower rigid substrate with a lower exfoliation layer positioned therebetween and forming an OLED array on the lower flexible substrate, forming an upper flexible substrate on an upper rigid substrate with an upper exfoliation layer positioned therebetween and forming a touch array on the upper flexible substrate, adhering the upper rigid substrate to the lower rigid substrate using an adhesive layer such that the touch array and the OLED array face each other, separating the upper exfoliation layer from the upper flexible substrate, cutting the lower rigid substrate on a unit panel basis, and separating the lower exfoliation layer from the lower flexible layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EXEMPLARY EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

Hereinafter, embodiments of an organic light emitting diode display device having a built-in touch panel will be described in detail with reference to the accompanying drawings.

Figure 1:
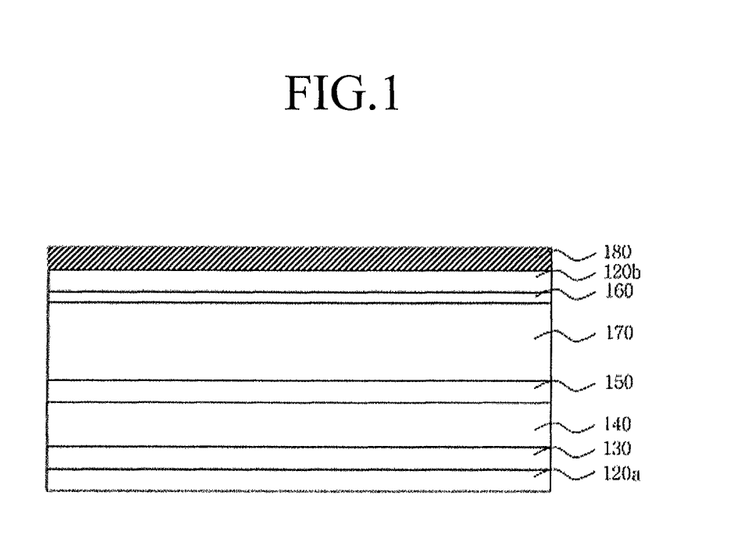
FIG. 1 is a sectional view of an organic light emitting diode (OLED) display device having a built-in touch panel, according to an embodiment of the present invention.

FIG. 1 is a sectional view of an organic light emitting diode (OLED) display device having a built-in touch panel, according to an embodiment of the present invention.

Figure 2A:
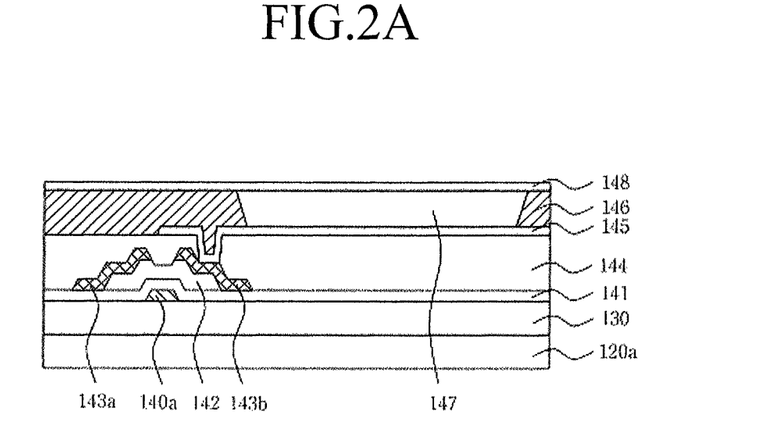
FIG. 2A is a sectional view of an OLED array of the OLED display device of FIG. 1.
Figure 2B:
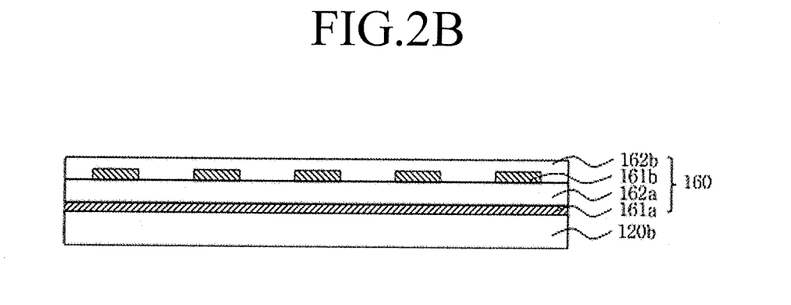
FIG. 2B is a sectional view of a touch array of the OLED display device of FIG. 1.

FIG. 2A is a sectional view of an OLED array 140 of the OLED display device of FIG. 1. FIG. 2B is a sectional view of a touch array 160 of the OLED display device of FIG. 1.

As illustrated in FIG. 1, the OLED display device having a built-in touch panel includes the OLED array 140 formed on a lower flexible substrate 120a and the touch array 160 formed on an upper flexible substrate 120b. The lower and upper flexible substrates 120a and 120b are adhered to each other by an adhesive layer 170 such that the touch array 160 and the OLED array 140 face each other.

In particular, the lower flexible substrate 120a is a plastic film formed of at least one organic material selected from among polyethylene naphthalate (PEN), polyethylene terephthalate (PET), polyethylene ether phthalate, polycarbonate, polyarylate, polyether imide, polyether sulfonate, polyimide, and polyacrylate.

A buffer layer 130 is formed between the lower flexible substrate 120a and the OLED array 140. The buffer layer 130 improves adhesion between the OLED array 140 and the lower flexible substrate 120a and prevents moisture or impurities from diffusing into the OLED array 140 from the lower flexible substrate 120a. The buffer layer 130 may be a single layer structure of an inorganic insulator such as silicon oxide ($SiO_x$), silicon nitride ($SiN_x$), or the like or a double-layered structure of $SiO_x$ and $SiN_x$.

The OLED array 140 is formed on the lower flexible substrate 120a with the buffer layer 130 positioned therebetween. As illustrated in FIG. 2A, the OLED array 140 includes a thin film transistor (TFT) including a gate electrode 140a, a gate insulating layer 141, a semiconductor layer 142, a source electrode 143a, and a drain electrode 143b and an OLED including a first electrode 145, an organic emission layer (EML) 147, and a second electrode 148.

In particular, the gate electrode 140a is formed on the buffer layer 130, and the gate insulating layer 141 is formed to cover the gate electrode 140a. The semiconductor layer 142 is formed on the gate insulating layer 141 to overlap with the gate electrode 140a. The source and drain electrodes 143a and 143b are formed on the semiconductor layer 142 to be spaced apart from each other.

An organic layer 144 formed of an acryl-based resin or the like is formed to cover the TFT. The organic layer 144 planarizes the lower flexible substrate 120a on which the TFT is formed. Although not shown, an inorganic layer (not shown) formed of $SiO_x$, $SiN_x$, or the like is formed between the gate insulating layer 141 and the organic layer 144. The inorganic layer may improve the stability of an interface between the organic layer 144 and each of the gate insulating layer 141, the source electrode 143a, and the drain electrode 143b.

The second electrode 148 is formed on the organic layer 144 to cover the first electrode 145 connected to the drain electrode 143b, a bank insulating layer 146 that partially exposes the first electrode 145, and the organic EML 147 formed on the exposed portion of the first electrode 145. The bank insulating layer 146 defines a light-emitting region of the OLED array 140 and prevents light leakage of a non-light-emitting region.

Referring back to FIG. 1, a passivation layer 150 is formed to cover the OLED array 140. The passivation layer 150 may have a single layer structure of an inorganic insulator, such as aluminum oxide ($AlO_x$), silicon oxynitride (SiON), silicon nitride ($SiN_x$), or silicon oxide ($SiO_x$) or an organic insulator such as benzocyclobutene or photoacryl. Alternatively, the passivation layer 150 may have a structure in which layers respectively formed of the inorganic insulator and the organic insulator are stacked one upon another.

Although not shown, a drive IC is formed at one side of the lower flexible substrate 120a, and the drive IC is connected to a printed circuit board (PCB). The PCB includes a timing control unit (not shown) for supplying various control signals to drive the OLED array 140 and a power supply (not shown) to supply a driving voltage. A signal of the PCB is applied to the OLED array 120a via the drive IC.

In particular, the PCB is integrally formed with a flexible PCB (FPCB) including a touch controller to drive the touch array 160. The FPCB is electrically connected to the touch array 160 via an anisotropic conductive paste (ACP), which will be described below.

The touch array 160 formed on the upper flexible substrate 120b is adhered to the passivation layer 150 by an adhesive layer 170 so that the touch array 160 and the OLED array 140 face each other. In this regard, the upper flexible substrate 120b is a plastic film formed of at least one organic material selected from PEN, PET, polyethylene ether phthalate, polycarbonate, polyarylate, polyether imide, polyether sulfonate, polyimide, and polyacrylate, like the lower flexible substrate 120a.

In particular, as illustrated in FIG. 2B, the touch array 160 formed on the upper flexible substrate 120b includes a plurality of X electrodes 161a and a plurality of Y electrodes 161b that cross each other with a first insulating layer 162a positioned therebetween and take the form of a bar and a second insulating layer 162b to cover the Y electrodes 161b.

The X and Y electrodes 161a and 161b of the touch array 160 are connected to pad parts by routing lines. In this regard, the pad parts are voltage applying pads or voltage detection pads. The touch array 160 is of a mutual capacitive type in which a driving voltage is applied to the X electrodes 161a and the Y electrodes 161b sense voltage drop according to whether touch is performed or not.

In some embodiments, the touch array 160 may include bridge electrodes formed on the upper flexible substrate 120b, a first insulating layer covering the bridge electrodes, X electrodes formed on the first insulating layer and electrically connected via the bridge electrodes, Y electrodes formed at the same layer level as the X electrodes, and a second insulating layer covering the X and Y electrodes.

Referring back to FIG. 1, the adhesive layer 170 is formed on the touch array 160. In addition, the adhesive layer 170 is attached to the passivation layer 150. In such a manner, the upper and lower flexible substrates 120b and 120a are adhered such that the touch array 160 and the OLED array 140 face each other.

Although not shown, the touch array 160 and the OLED array 140 are electrically connected to each other via an ACP. The ACP has a structure in which conductive balls coated with a metal such as gold (Au), silver (Ag), copper (Cu), molybdenum (Mo), or the like are dispersed in a sealant.

The ACP connects the pad parts of the touch array 160 to the FPCB. The pad parts are connected to X and Y electrodes 161a and 161b of the touch array 160 via routing lines.

In general, an FPCB to drive a touch array is separately formed from a PCB to drive an OLED array. However, in embodiments, the PCB to drive the OLED array 130 is integrally formed with the FPCB to drive the touch array 160, and the FPCB and the touch array 160 are connected to each other using an ACP.

Therefore, in the OLED display device having a built-in touch panel, manufacturing costs may be reduced by integrating the FPCB to drive the touch array 160 with the PCB to drive the OLED array 140.

In addition, a top cover 180 is attached to a rear surface of the upper flexible substrate 120b on which the touch array 160 is formed. The top cover 180 is formed of a material having high transmittance and flexibility, such as polymethylmethacrylate (PMMA), polyurethane (PU), acryl, cyclo olefin polymer (COP), polyethylene terephthalate (PET), polyethylene naphthalate (PEN), polyimide, or the like.

In addition, although not shown, a bottom cover formed of a material, such as PMMA, PU, acryl, COP, PET, PEN, polyimide, or the like may be formed on a rear surface of the lower flexible substrate 120a.

As described above, the OLED array 140 and the touch array 160 are respectively formed on the lower flexible substrate 120a and the upper flexible substrate 120b, and thus the OLED display device having a built-in touch panel has flexibility. In particular, a flexible substrate has a smaller thickness than a general rigid substrate and thus may enable reduction in display device thickness.

Moreover, the FPCB for driving the touch array 160 is formed on the PCB for driving the OLED array 140 and the FPCB is electrically connected to the touch array 160 via an ACP, and thus manufacturing costs may be reduced.

Hereinafter, a method of manufacturing the OLED display device having a built-in touch panel will be described in detail with reference to the accompanying drawings.

—First Embodiment—

FIGS. 3A through 3H are sectional views sequentially illustrating a method of manufacturing the OLED display device having a built-in touch panel, according to a first embodiment of the present invention. FIG. 4A is a photograph of the upper flexible substrate 120b from which an upper exfoliation layer 110b is separated upon ultraviolet irradiation. FIGS. 4B and 4C are photographs showing a case in which wiring defects of the touch array 160 do not occur when the upper exfoliation layer is separated using ultraviolet irradiation.

Figure 3A:
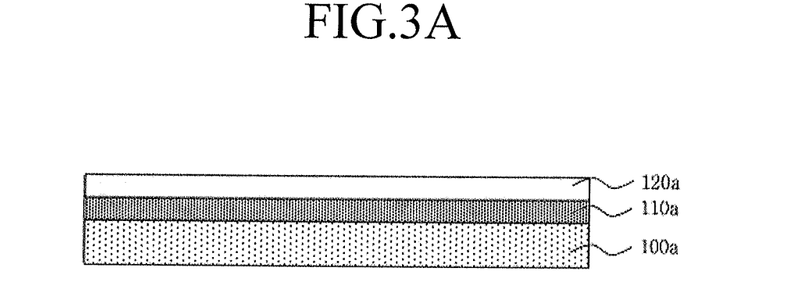
FIGS. 3A through 3H are sectional views sequentially illustrating a method of manufacturing the OLED display device having a built-in touch panel, according to a first embodiment of the present invention.
Figure 4A:
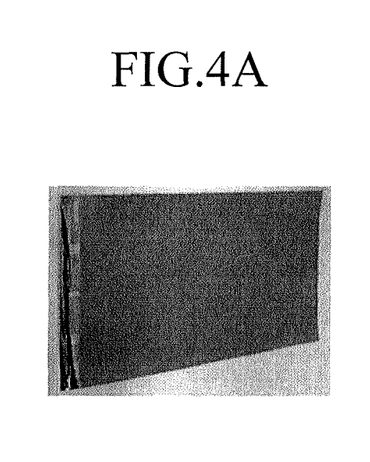
FIG. 4A is a photograph of an upper flexible substrate from which an upper exfoliation layer is separated using ultraviolet irradiation.
Figure 4B:
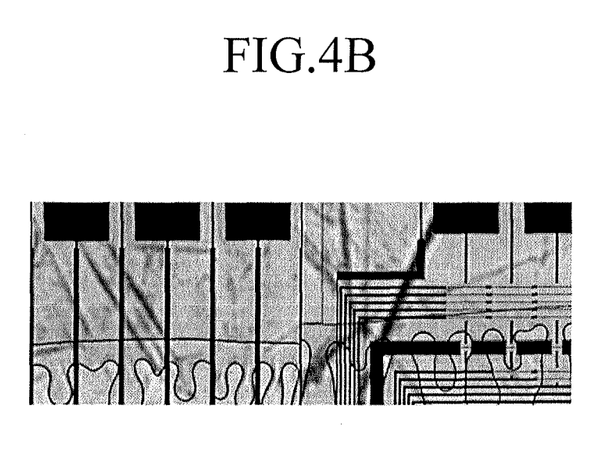
FIGS. 4B and 4C are photographs showing a case in which wiring defects of the touch array do not occur when the upper exfoliation layer is separated upon ultraviolet irradiation.
Figure 4C:
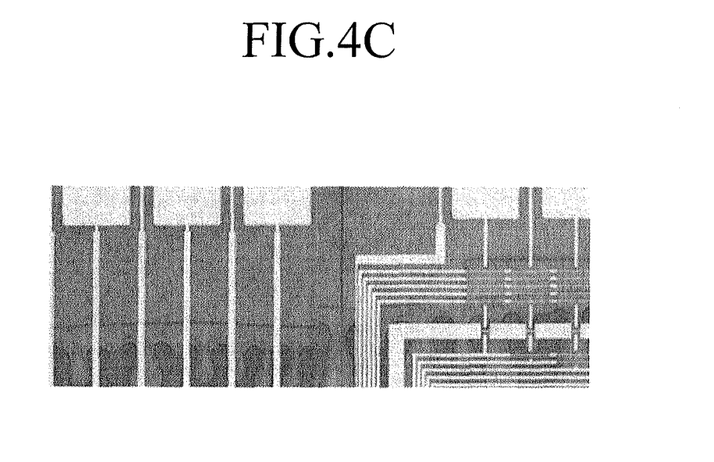

As illustrated in FIG. 3A, a lower exfoliation layer 110a is formed on a lower rigid substrate 100a such as a glass substrate, and the lower flexible substrate 120a is formed on the lower exfoliation layer 110a. The lower flexible substrate 120a is a plastic film formed by coating the lower exfoliation layer 110a with a polymer solution by slit coating, spin coating, or the like and curing the polymer solution coated thereon.

The plastic film is formed of at least one organic material selected from PEN, PET, polyethylene ether phthalate, polycarbonate, polyarylate, polyether imide, polyether sulfonate, polyimide, and polyacrylate.

Figure 3B:
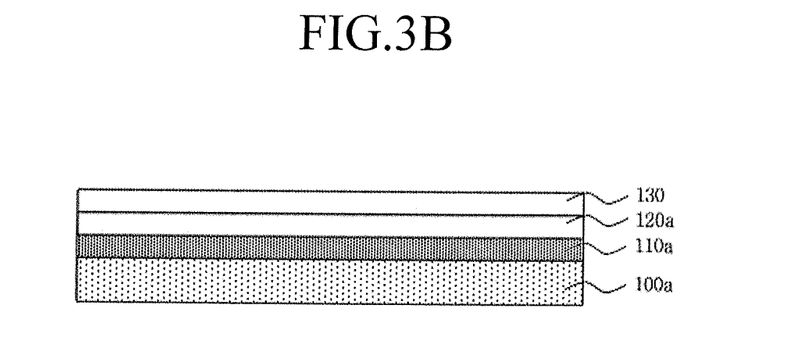

As illustrated in FIG. 3B, the buffer layer 130 is formed on the lower flexible substrate 120a. The buffer layer 130 improves adhesion between the lower flexible substrate 120a and the OLED array 140, which will be described below and prevents moisture or impurities from diffusing into the OLED array 140 from the lower flexible substrate 120a. The buffer layer 130 may have a single layer structure of an inorganic insulator such as $SiO_x$, $SiN_x$, or the like or a double-layered structure including two layers of $SiO_x$ and $SiN_x$.

Figure 3C:
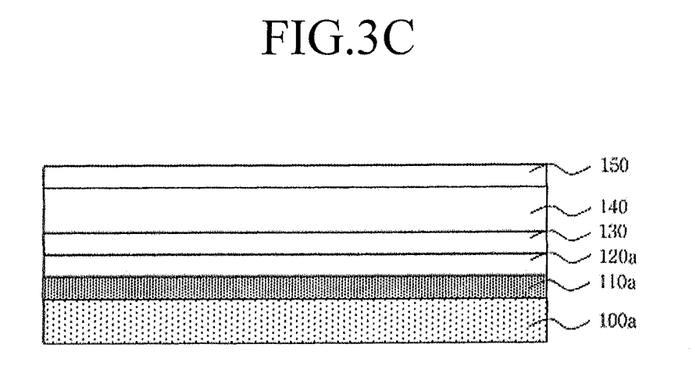

Subsequently, as illustrated in FIG. 3C, the OLED array 140 is formed on the buffer layer 130, and the passivation layer 150 is formed on the OLED array 140. In particular, the OLED array 140 includes a TFT including a gate electrode, a gate insulating layer, a semiconductor layer, and source and drain electrodes and an OLED including a first electrode, an organic EML, and a second electrode.

First, the gate electrode is formed on the buffer layer 130, and the gate insulating layer is formed to cover the gate electrode. In addition, the semiconductor layer is formed on the gate insulating layer to overlap with the gate electrode, and the source and drain electrodes spaced apart from each other are formed on the semiconductor layer.

The organic layer 144 formed of an acryl-based resin or the like is formed to cover the TFT. The organic layer 144 planarizes the lower flexible substrate 120a on which the TFT is formed. Although not shown, an inorganic layer formed of $SiO_x$, $SiN_x$, or the like is formed between the gate insulating layer and the organic layer 144 and thus may improve the stability of an interface between the organic layer 144 and each of the gate insulating layer, the source electrode, and the drain electrode.

The second electrode is formed on the organic layer 144 to cover the first electrode connected to the drain electrode, a bank insulating layer that partially exposes the first electrode, and the organic EML formed on the exposed portion of the first electrode. The bank insulating layer defines a light-emitting region of the OLED array 140 and prevents light leakage of a non-light-emitting region.

Next, the passivation layer 150 is formed on the OLED array 140. The passivation layer 150 may have a single layer structure of an inorganic insulator, such as $AlO_x$, $SiON$, $SiN_x$, or $SiO_x$ or an organic insulator such as benzocyclobutene or photoacryl. Alternatively, the passivation layer 150 may have a structure in which layers respectively formed of the inorganic insulator and the organic insulator are stacked one upon another.

Figure 3D:
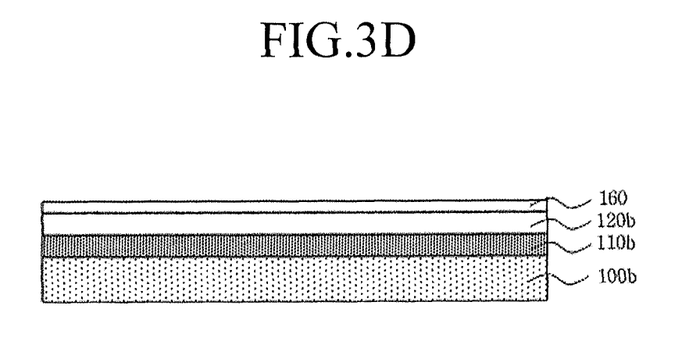

Subsequently, as illustrated in FIG. 3D, the touch array 160 is formed on the upper flexible substrate 120b. In this regard, the upper flexible substrate 120b is a plastic film formed by coating the upper exfoliation layer 110b formed on an upper rigid substrate 100b formed of glass with the above-described polymer by slit coating, spin coating, or the like and curing the polymer coated on the upper exfoliation layer 110b.

Next, the touch array 160 is formed on the upper flexible substrate 120b. The touch array 160 is formed such that a plurality of X electrodes and a plurality of Y electrodes that cross each other with a lower insulating layer positioned therebetween and take the form of a bar are formed on the upper flexible substrate 120b and an upper insulating layer is formed to cover the Y electrodes. The X and Y electrodes are connected to pad parts by routing lines, and the pad parts are voltage applying pads or voltage detection pads.

The touch array 160 is of a mutual capacitive type in which a driving voltage is applied to the X electrodes and the Y electrodes sense voltage drop according to whether touch is performed or not.

In some embodiments, the touch array 160 may include bridge electrodes formed on the upper flexible substrate 120b, an insulating layer covering the bridge electrodes, X electrodes formed on the insulating layer and electrically connected via the bridge electrodes, and Y electrodes formed at the same layer level as the X electrodes.

Figure 3E:
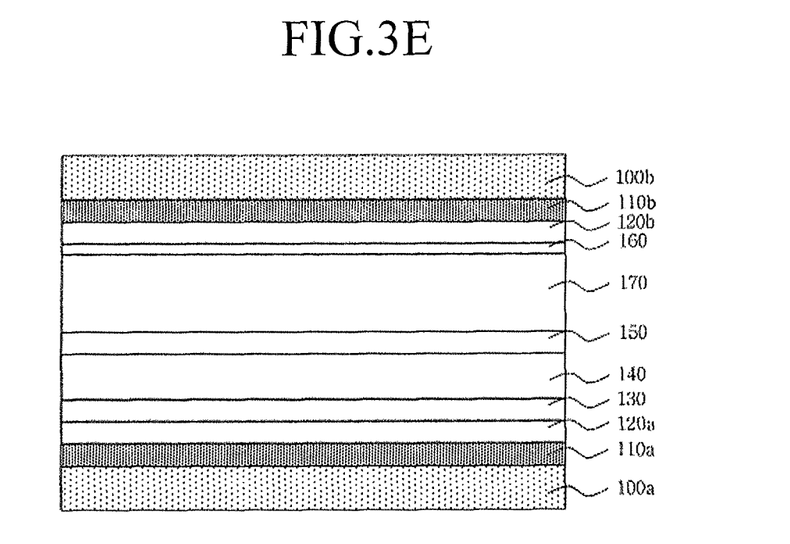

Next, as illustrated in FIG. 3E, the adhesive layer 170 is formed on the touch array 160, and the adhesive layer 170 is attached to the passivation layer 150. The lower and upper rigid substrates 100a and 100b are adhered by curing the adhesive layer 170 so that the touch array 160 and the OLED array 140 face each other.

Figure 3F:
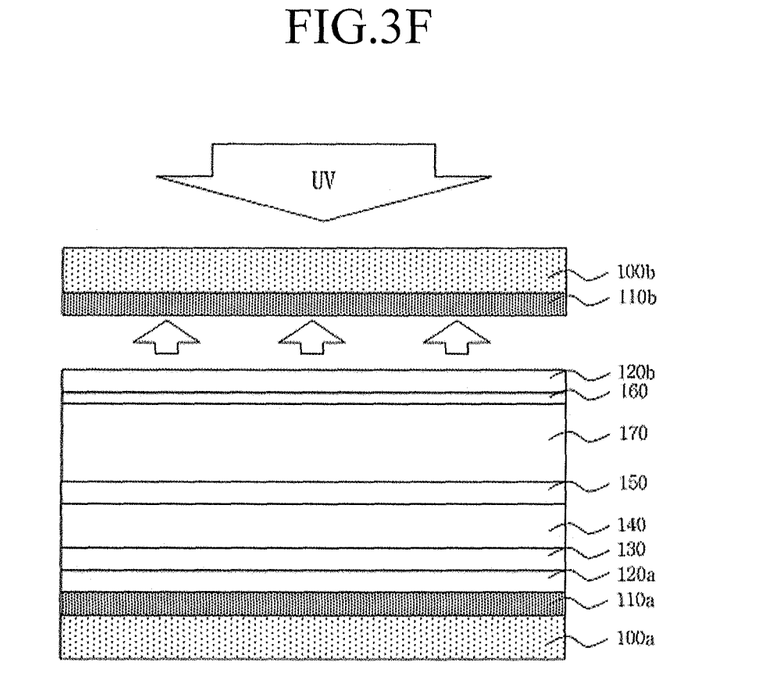

Subsequently, as illustrated in FIG. 3F, an ultraviolet irradiator is positioned above the upper rigid substrate 100b, and the upper rigid substrate 100b is irradiated with ultraviolet light. The upper exfoliation layer 110b loses adhesive strength upon ultraviolet irradiation and thus, as illustrated in FIG. 4A, the upper exfoliation layer 110b is separated from a rear surface of the upper flexible substrate 120b via ultraviolet irradiation. In this regard, as illustrated in FIGS. 4B and 4C, routing lines of the touch array 160 are not disconnected.

Although not shown, the lower rigid substrate 100a is cut on a unit panel basis, and then the PCB for driving the OLED array 140 is integrally formed with the FPCB for driving the touch array 160. In addition, the FPCB is connected to the touch array 160 using an ACP. In this regard, the ACP has a structure in which conductive balls coated with a metal such as Au, Ag, Cu, Mo, or the like are dispersed in a sealant.

Figure 3G:
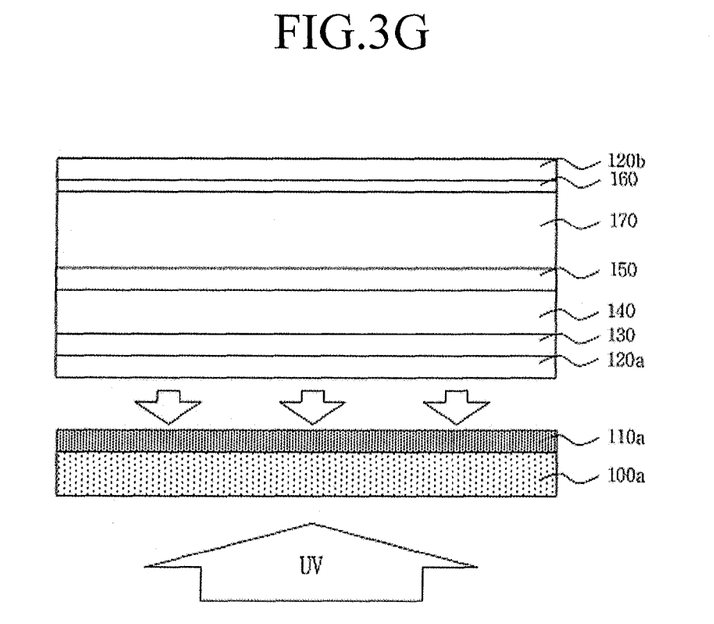

Subsequently, as illustrated in FIG. 3G, an ultraviolet irradiator is positioned below the lower rigid substrate 100a, and then the lower rigid substrate 100a is irradiated with ultraviolet light. As with the upper exfoliation layer 110b, the lower exfoliation layer 110a also loses adhesive strength upon ultraviolet irradiation and thus is separated from a rear surface of the lower flexible substrate 120a by the irradiated ultraviolet light.

That is, in the OLED display device having a built-in touch panel described above, after removal of the upper rigid substrate 100b, the OLED array 140 and the touch array 160 are cut on a unit panel basis and then the lower rigid substrate 100a is removed. In another embodiment, however, after removal of the lower rigid substrate 100a, the OLED array 140 and the touch array 160 may be cut on a unit panel basis and then the upper rigid substrate 100b may be removed.

As described above, the lower and upper rigid substrates 100a and 100b are separately removed. This is because when the PCB for driving the OLED array 140, the ACP, and the like are attached to the lower and upper flexible substrates 120a and 120b in a case in which only the lower and upper flexible substrates 120a and 120b remain, the lower and upper flexible substrates 120a and 120b may bend, resulting in poor attachment.

Figure 3H:
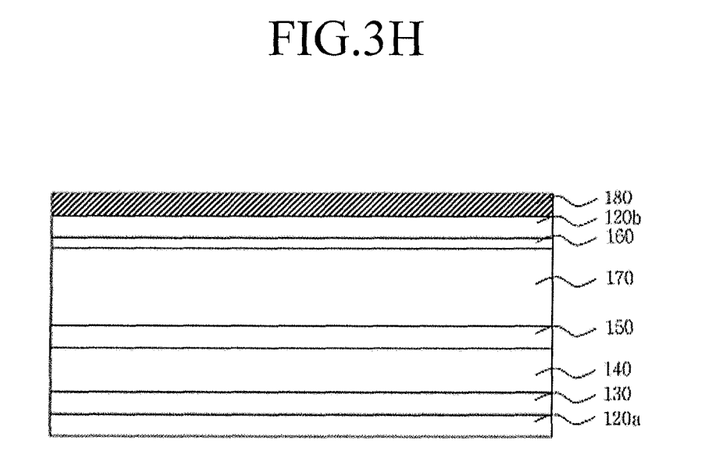

Lastly, as illustrated in FIG. 3H, the top cover 180 is attached to the rear surface of the upper flexible substrate 120b. The top cover 180 is formed of a material having high transmittance and flexibility, such as PMMA, PU, acryl, COP, PET, PEN, polyimide, or the like.

In addition, although not shown, a bottom cover may be formed on a rear surface of the lower flexible substrate 120a. The bottom cover is formed of a material such as PMMA, PU, acryl, COP, PET, PEN, polyimide, or the like.

—Second Embodiment—

In a manufacturing method of the OLED display device having a built-in touch panel, according to a second embodiment of the present invention, an exfoliation layer formed between a rigid substrate and a flexible substrate is formed of a metal or a transparent conductive oxide and thus, when a high voltage is applied to the exfoliation layer, the exfoliation layer is separated from the flexible substrate.

FIGS. 5A through 5F are sectional views sequentially illustrating a method of manufacturing the OLED display device having a built-in touch panel, according to a second embodiment of the present invention. FIG. 6A is a photograph of an upper flexible substrate 200b from which an upper exfoliation layer 210b is separated by application of a certain voltage. FIGS. 6B and 6C are photographs showing a case in which wiring defects of the touch array 160 do not occur when the upper exfoliation layer 210b is separated by application of a certain voltage.

Figure 5A:
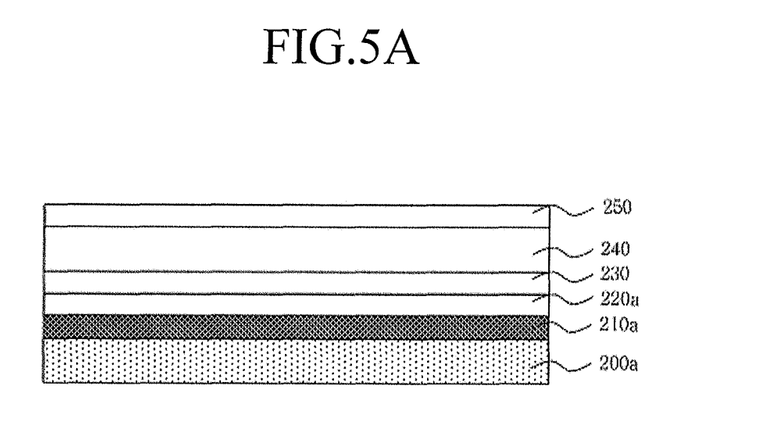
FIGS. 5A through 5F are sectional views sequentially illustrating a method of manufacturing the OLED display device having a built-in touch panel, according to a second embodiment of the present invention.
Figure 6A:
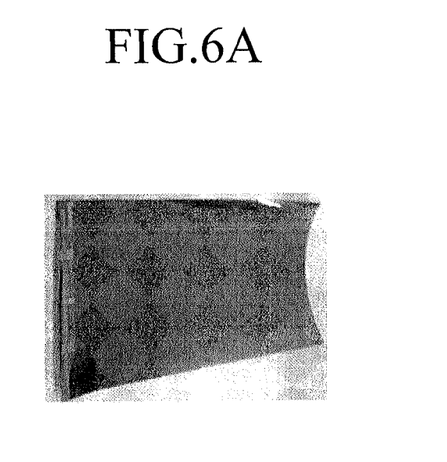
FIG. 6A is a photograph of an upper flexible substrate from which an upper exfoliation layer is separated by application of a certain voltage.
Figure 6B:
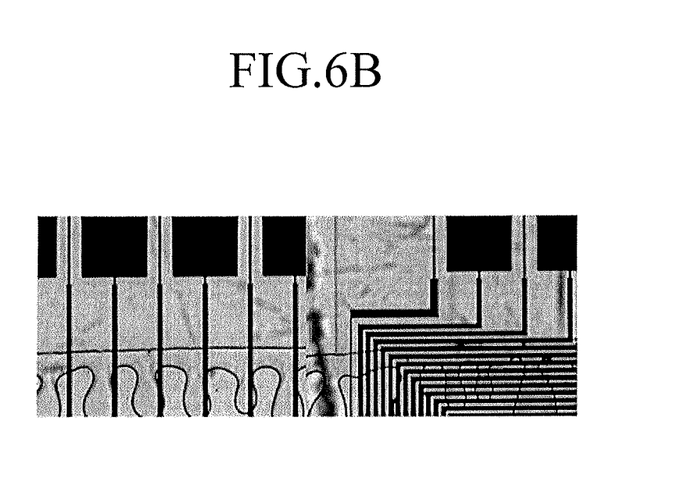
FIGS. 6B and 6C are photographs showing a case in which wiring defects of a touch array do not occur when the upper exfoliation layer is separated by application of a voltage.
Figure 6C:
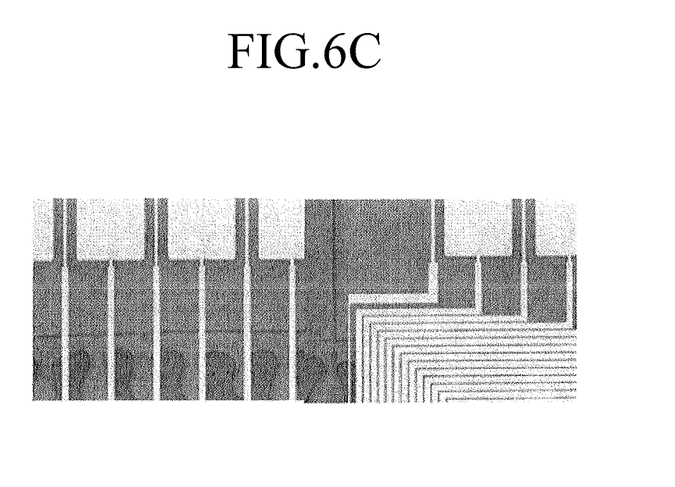

As illustrated in FIG. 5A, a lower exfoliation layer 210a is formed on a lower rigid substrate 200a formed of, for example, glass, and a lower flexible substrate 220a is formed on the lower exfoliation layer 210a. In this regard, the lower exfoliation layer 210a is formed of a metal such as molybdenum (Mo), aluminum (Al), or the like, or a transparent conductive oxide such as indium tin oxide (ITO), indium zinc oxide (IZO), indium tin zinc oxide (ITZO), or the like.

The lower exfoliation layer 210a is used to separate the lower rigid substrate 200a from the lower flexible substrate 220a. In this regard, when the thickness of the lower exfoliation layer 210a is too small or too large, separation characteristics deteriorate when the lower exfoliation layer 210a is separated from the lower flexible substrate 220a. Thus, the thickness of the lower exfoliation layer 210a may range from 1,000 Å to 3,000 Å.

The lower flexible substrate 220a is formed on the lower exfoliation layer 210a, and an OLED array 240 is formed on the lower flexible substrate 220a, with a buffer layer 230 positioned therebetween.

The OLED array 240 includes a TFT and an OLED connected to the TFT. The TFT includes a gate electrode, a gate insulating layer, a semiconductor layer, and source and drain electrodes, and the OLED includes a first electrode, an organic EML, and a second electrode. A passivation layer 250 is formed on the OLED array 240.

Figure 5B:
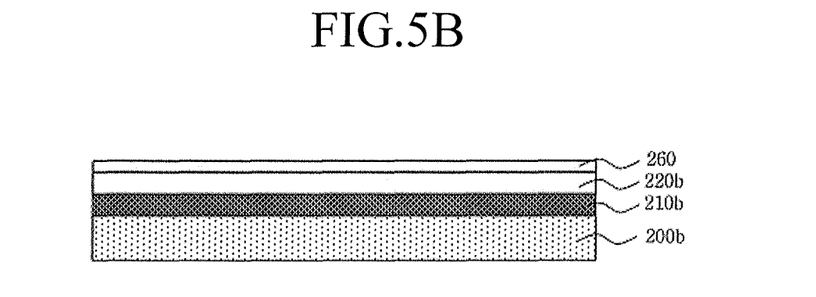

Subsequently, as illustrated in FIG. 5B, a touch array 260 is formed on the upper flexible substrate 220b. In this regard, as with the lower flexible substrate 220a, an upper exfoliation layer 210b is formed on an upper rigid substrate 200b formed of, for example, glass. The upper exfoliation layer 210b is also formed of a metal such as Mo, Al, or the like, or a transparent conductive oxide such as ITO, IZO, ITZO, or the like. The thickness of the upper exfoliation layer 210b ranges from 1,000 Å to 3,000 Å.

Next, the upper exfoliation layer 210b is coated with the above-described polymer using a method such as slit coating, spin coating, or the like and the polymer coated on the upper exfoliation layer 210b is cured, to form the upper flexible substrate 220b. Subsequently, the touch array 260 is formed on the upper flexible substrate 220b. The touch array 260 includes a plurality of X electrodes and a plurality of Y electrodes that cross each other with a lower insulating layer positioned therebetween and take the form of a bar, and an upper insulating layer to cover the Y electrodes. The X and Y electrodes are connected to pad parts, such as voltage applying pads or voltage detection pads, by routing lines.

In some embodiments, the touch array 260 may include bridge electrodes formed on the upper flexible substrate 220b, an insulating layer to cover the bridge electrodes, X electrodes formed on the insulating layer and electrically connected via the bridge electrodes, and Y electrodes formed at the same layer level as the X electrodes.

Figure 5C:
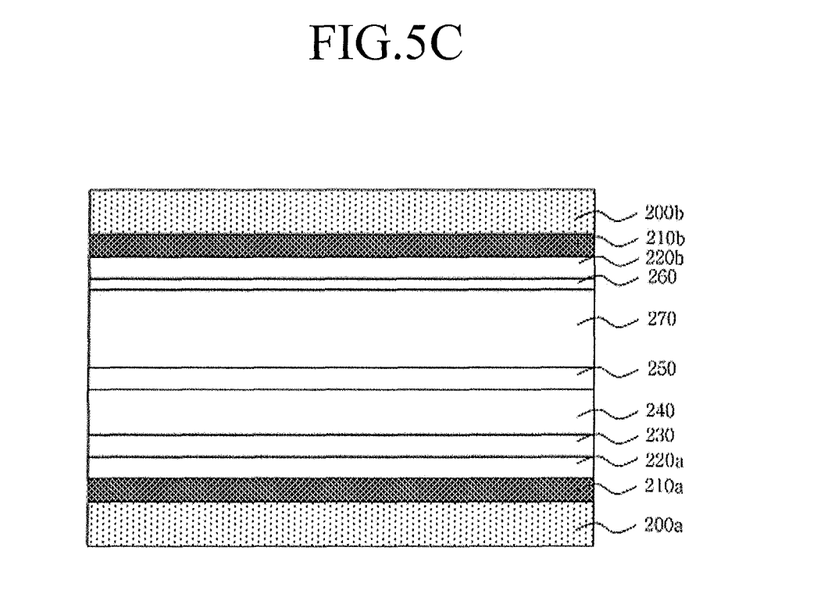

Next, as illustrated in FIG. 5C, an adhesive layer 270 is formed on the touch array 260, and the adhesive layer 270 is attached to the passivation layer 250. Then, the lower and upper rigid substrates 200a and 200b are adhered by curing the adhesive layer 270 so that the touch array 260 and the OLED array 240 face each other.

Figure 5D:
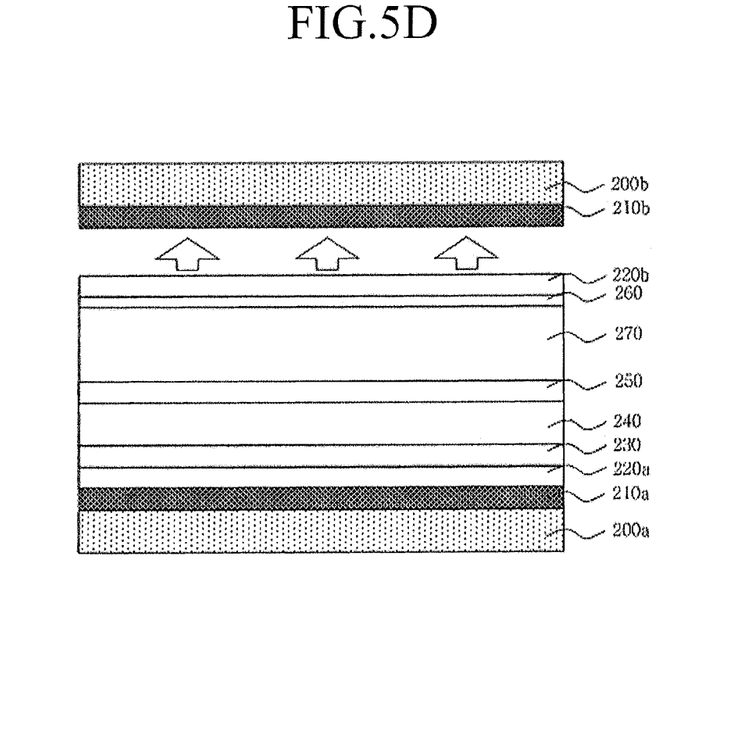

Subsequently, a high voltage, i.e., 3 kV to 5 kV, is applied to the upper exfoliation layer 210b using a voltage applying device. In this regard, the voltage is applied for a period on the order of a microsecond, and thus the high voltage applied to the upper exfoliation layer 210b is a pulse type voltage. Due to this, as illustrated in FIG. 5D, a gap is formed between the upper exfoliation layer 210b formed of a metal or a transparent conductive oxide and the upper flexible substrate 220b formed of a plastic film. Thus, as illustrated in FIG. 6A, the upper exfoliation layer 210b is separated from a rear surface of the upper flexible substrate 220b. In this regard, as illustrated in FIGS. 6B and 6C, routing lines of the touch array 260 are not disconnected.

Although not shown, the lower rigid substrate 200a is cut on a unit panel basis, a PCB for driving the OLED array 240 is integrally formed with an FPCB for driving the touch array 260, and the FPCB is connected to the touch array 260 using an ACP.

Figure 5E:
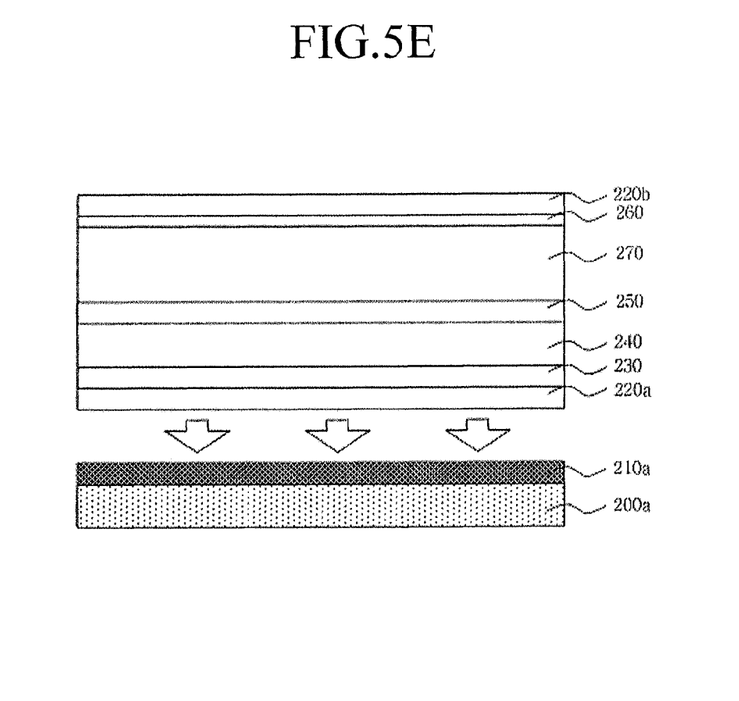

Subsequently, a pulse type high voltage ranging from 3 kV to 5 kV is also applied to the lower exfoliation layer 210a. As illustrated in FIG. 5E, when the voltage is applied to the lower exfoliation layer 210a, a gap is formed between the lower exfoliation layer 210a formed of a metal or a transparent conductive oxide and the lower flexible substrate 220a formed of a plastic film. Accordingly, the lower exfoliation layer 210a is separated from the lower flexible substrate 220a.

Figure 5F:
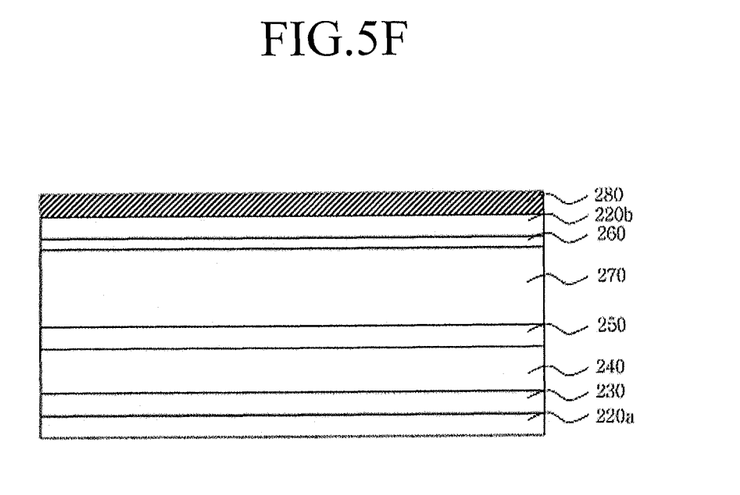

Next, as illustrated in FIG. 5F, a top cover 280 is attached to a rear surface of the upper flexible substrate 220b from which the upper exfoliation layer 210a has been separated. The top cover 280 is formed of a material such as PMMA, PU, acryl, COP, PET, PEN, polyimide, or the like. Although not shown, a bottom cover may be formed on a rear surface of the lower flexible substrate 220a.

According to the manufacturing method of the OLED display device having a built-in touch panel, a flexible substrate is formed on a rigid substrate with an exfoliation layer positioned therebetween, and an OLED array or a touch array is formed on the flexible substrate. In addition, the rigid substrate is separated from the flexible substrate using ultraviolet light. Therefore, an OLED display device including a built-in touch panel and having flexibility may be manufactured.

In particular, the OLED display device may be manufactured by integrating a PCB for driving the OLED array with an FPCB for driving the touch array, and thus manufacturing costs may be reduced.

As is apparent from the above description, the OLED display device having a built-in touch panel and the manufacturing method thereof have the following effects.

First, an OLED array and a touch array are formed on respective flexible substrates, and thus the OLED display device having a built-in touch panel has flexibility and decreased thickness.

Second, an FPCB for driving the touch array and a PCB for driving the OLED array are integrally installed, and thus manufacturing costs may be reduced.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of manufacturing an organic light emitting diode (OLED) display device having a built-in touch panel, the method comprising:
   forming a lower flexible substrate on a lower rigid substrate with a lower exfoliation layer positioned therebetween and forming an OLED array on the lower flexible substrate;
   forming an upper flexible substrate on an upper rigid substrate with an upper exfoliation layer positioned therebetween and forming a touch array on the upper flexible substrate;
   adhering the upper rigid substrate to the lower rigid substrate using an adhesive layer such that the touch array and the OLED array face each other;
   separating the upper exfoliation layer from the upper flexible substrate;
   cutting the lower rigid substrate on a unit panel basis; and
   separating the lower exfoliation layer from the lower flexible layer.

2. The method according to claim 1, wherein the separating of the upper exfoliation layer and the separating of the lower exfoliation layer are performed using an ultraviolet irradiator.

3. The method according to claim 2, wherein the upper and lower exfoliation layers have a reduced adhesive strength upon ultraviolet irradiation.

4. The method according to claim 1, wherein the separating of the upper exfoliation layer and the separating of the lower exfoliation layer are performed using a voltage applying device by applying a pulse type voltage to the upper and lower exfoliation layers.

5. The method according to claim 4, wherein the upper exfoliation layer and the lower exfoliation layer comprise a metal or a transparent conductive oxide.

6. The method according to claim 4, wherein the upper exfoliation layer and the lower exfoliation layer each have a thickness of 1,000 Å to 3,000 Å.

7. The method according to claim 4, wherein the pulse type voltage is in a range of 3 kV to 5 kV.

8. The method according to claim 1, wherein the adhering comprises connecting a pad part connected to X and Y electrodes via a routing line of the touch array to the OLED array using an anisotropic conductive paste.

9. The method according to claim 8, wherein the anisotropic conductive paste has a first end connected to the pad part and a second end formed on the lower flexible substrate and connected to a flexible printed circuit board for driving the touch array.

10. The method according to claim 9, wherein the flexible printed circuit board is integrally formed with a printed circuit board electrically connected to the OLED array to drive the OLED array.

\* \* \* \* \*